United States Patent
Gilleo et al.

(10) Patent No.: US 6,323,062 B1
(45) Date of Patent: Nov. 27, 2001

(54) WAFER COATING METHOD FOR FLIP CHIPS

(75) Inventors: Kenneth Burton Gilleo, Cranston, RI (US); David Blumel, New York, NY (US); James McLenaghan, North Kingstown, RI (US)

(73) Assignee: Alpha Metals, Inc., Jersey City, NJ (US)

( * ) Notice: Subject to any disclaimer, the term of this patent is extended or adjusted under 35 U.S.C. 154(b) by 0 days.

(21) Appl. No.: 09/395,553

(22) Filed: Sep. 14, 1999

Related U.S. Application Data

(63) Continuation-in-part of application No. 09/067,381, filed on Apr. 27, 1998, which is a continuation-in-part of application No. 09/266,166, filed on Mar. 10, 1999, now Pat. No. 6,228,678.

(51) Int. Cl.[7] .............................. H01L 21/44; H01L 21/48; H01L 21/50
(52) U.S. Cl. ..................... 438/114; 438/108; 438/110; 438/612
(58) Field of Search .................................... 438/106, 108, 438/110, 114, 612

(56) References Cited

U.S. PATENT DOCUMENTS 5,128,746    7/1992  Pennisi .
5,492,863  * 2/1996  Higgins, III .
5,543,585    8/1996  Booth et al. .

FOREIGN PATENT DOCUMENTS 853 337 A    7/1998  (EP) .
WO 98/02919  1/1998  (WO) .
WO99/04430   1/1999  (WO) .

OTHER PUBLICATIONS

Patent Abstracts of Japan, vol. 014, No. 546 (E–1008), Dec. 4, 1990 and JP 02 234447 A (NEC Corp.) Sep. 17, 1990 abstract.
Patent Abstracts of Japan, vol. 015, No. 125 (E–1050), Mar. 1991 & JP 03 012942 A (Sharp Corp., Jan. 21, 1991 abstract.

* cited by examiner

Primary Examiner—Kevin M. Picardat
Assistant Examiner—D. M. Collins
(74) Attorney, Agent, or Firm—Mintz, Levin, Cohn, Ferris, Glovsky & Popeo, P.C.

(57) ABSTRACT

A method for applying an underfill and edge coating to a flip chip is described. The method includes the steps of adhering a bumped wafer to an expandable carrier substrate, sawing the wafer to form individual chips, stretching the carrier substrate in a bidirectional manner to form channels between each of the individual chips, applying an underfill material to the bumped surfaces of the chips and around the edges of the chips, cutting the underfill material in the channels between the chips and removing the individual, underfill coated chips from the carrier.

14 Claims, 1 Drawing Sheet

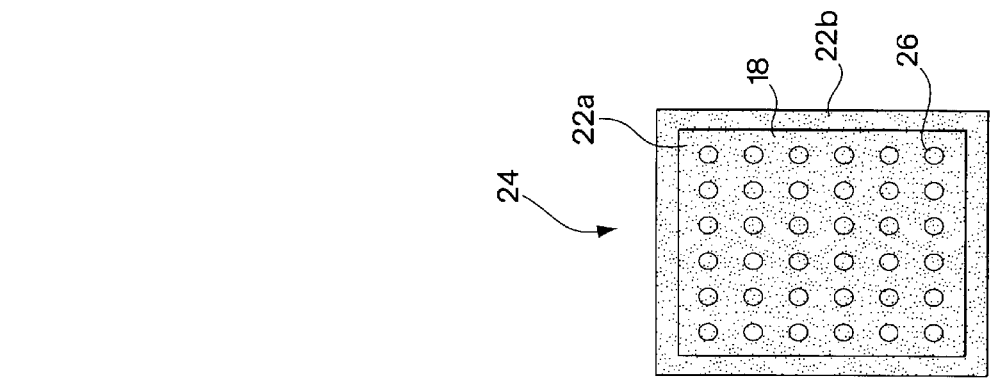
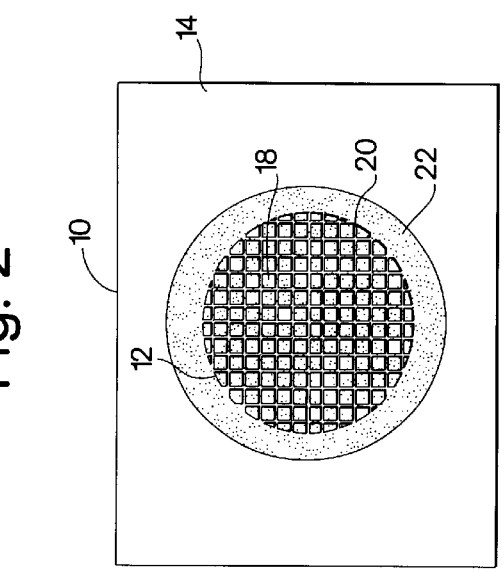
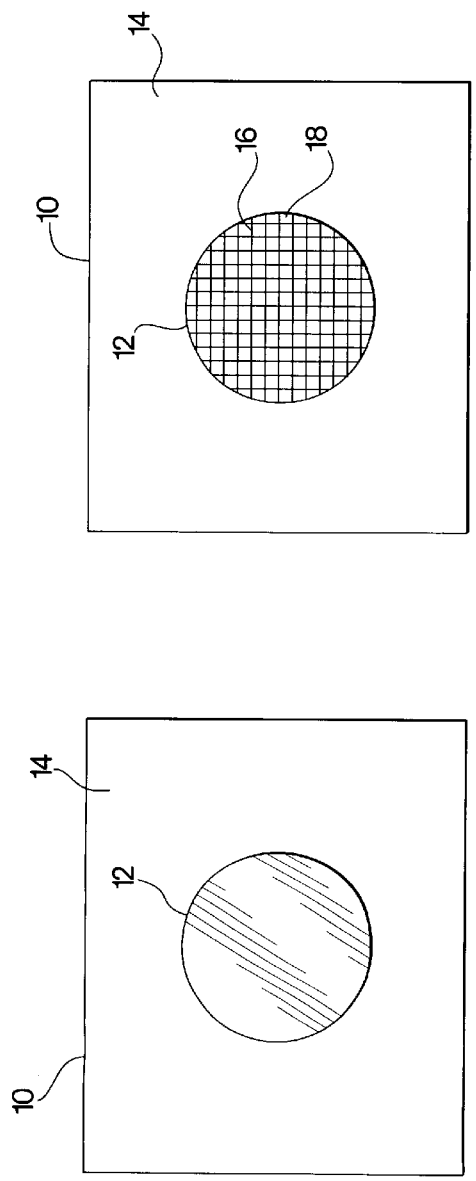

WAFER COATING METHOD FOR FLIP CHIPS

RELATED APPLICATIONS

This application is a continuation-in-part of U.S. application Ser. No. 09/067,381, entitled "Flip Chip With Integrated Flux and Underfill" filed Apr. 27, 1998, and a continuation-in-part of U.S. application Ser. No. 09/266,166, entitled "Flip Chip With Integrated Mask and Underfill" filed Mar. 10, 1999 now U.S. Pat. No. 6,228,678.

FIELD OF THE INVENTION

The present invention relates generally for methods of providing underfill materials on flip chips. More particularly, the present invention relates to a method in which a wafer is provided with solder bumps and diced prior to the application of a polymeric underfill material.

BACKGROUND OF THE INVENTION

Flip chip technology, although several decades old in the ceramic module area, has recently been applied to organic substrates. Flip chip methodologies, first employed over 30 years ago, involve directly attaching Integrated Circuits (ICs) to circuit boards by means of a joint instead of a wire. This method is also called Direct Chip Attach (DCA). Several mainframe computer makers and other manufacturers of electronic components, have used this flip chip technology to produce very efficient, high-density modules. The direct attachment of the ICs to circuit boards eliminates the IC component package that can occupy up to 50 times more space than the IC chip itself.

Many companies have used flip chips exclusively on ceramic circuits that have a low Coefficient of Thermal Expansion (CTE). In these applications, the chip and circuit have a relatively close thermomechanical match. As a result, upon heating, the IC and the substrate upon which it is mounted undergo similar thermal expansions with the result being that physical stresses between the IC and the substrate are minimized or maintained within acceptable limits. However, when flip chip technology is applied to the more common and considerably lower cost organic printed circuit boards, a large thermal mismatch results. Typical organic printed circuit boards (PCBs) have a CTE of 15 to 25 parts per million per ° C. (ppm/° C.) compared to only 2–3 ppm/° C. for silicon ICs. The results are that excessive stress is generated during thermal cycling of flip chips that have been attached to PCBs. These forces can be great enough to destroy the joints that connect the chip to the circuit.

One common solution to the flip chip thermal mismatch problem has been known for some time. Specifically, a liquid polymerizable material, called an "underfill", is flowed under the flip chip. Once the underfill has completely filled the small gap that exists between the bottom of the flip chip and the substrate, the material is hardened by polymerization. The hardened, polymerized underfill locks the flip chip and circuit board together so that there is little if any differential movement. As a result, the very rigid flip chip is mechanically coupled to the substrate by means of the underfill. Thus, the substrate expansion, at least at the interface, is restrained. This restraint causes the substrate adjacent to the flip chip to physically behave in a mainer that is similar to that of the flip chip. By controlling excessive stresses that would otherwise form in the joints between the chip and PCB, a reliable assembly can be fabricated.

While the use of underfill has solved the thermal mismatch problem for low cost flip chips on organic substrates, it has given rise to a series of significant manufacturing problems. First, the prepolymerized liquid underfill must be applied off-line as a secondary process with special equipment. Typically, the underfill is applied to one, two or three edges of the assembled flip chip and allowed to flow all the way under the mounted chip. Once the material has flowed to opposite edges and all air has been displaced from under the chip, additional underfill is dispensed to those outer edges to form a fillet so that that all four edges are symmetrical. The fillet increases reliability and is generally preferred even though it requires additional manufacturing time. Next the assembly is baked in an oven to polymerize and harden the underfill, again adding time to the process. This baking process can take several hours, although, new processes, such as microwave curing, may reduce the time substantially. However, the added equipment and its maintenance adds significantly to manufacturing costs. Thus, while the use of underfill helps to alleviate the thermal mismatch problem and provides a commercial solution, the electronic device manufacturing industry seeks more efficient manufacturing methods with lower associated costs. In fact, many in the industry believe that the present burden imposed by underfill processing may inhibit industry wide use of flip chip technology.

Recently, advances have been made which improve and streamline the underfill process. One method that has shown some commercial interest involves dispensing underfill before assembling the flip chip to the board. The method requires that the underfill permit solder joints to form. Soldering of flip chips to circuits is generally accomplished by applying flux to the solder bumps on the flip chip or to the circuit pads on the circuit. An underfill that is pre-dispensed before soldering should contain flux or have properties that facilitate solder joint formation. Since the pads on circuit often oxidize and since tin/lead solder bumps on flip chips are always oxidized, the flux must be designed to reduce these oxide coatings and facilitate solder joint formation. These so called, pre-dispensed underfills, have therefore been designed to include flux chemistry. While simplifying the flip chip process, they still require extra steps and cannot be run on a standard surface mount assembly line.

In spite of the numerous advantages provided by flip chip technology, a need still exists for flip chip methods which simplify the application of underfill. A need also exists for process methodologies which reduce the number of process steps required with underfill application.

SUMMARY OF THE INVENTION

The present invention relates to a method for applying underfill to flip chips prior to assembling such chips on printed circuit boards. The invention is characterized in that it simplifies the process of applying the underfill, permits conventional sawing methods to be used in singulating the wafer and provides underfill not only on the underside of each chip but along each edge of the chip as well.

More particularly, the present invention relates to a process which includes the steps of providing an expandable adhesive substrate having adhered thereto a wafer having solder bumps, cutting or sawing the wafer to define one or more individual integrated circuit chips, stretching the adhesive substrate in a manner which separates each individual integrated circuit from those adjacent to it, and providing an underfill material on the bumped surface and along each edge of each integrated circuit. The resulting underfill-coated chips can then be removed from the adhesive substrate and individually packaged for transport and storage until they are applied to a printed circuit.

Once positioned on a printed circuit board, the assembly is transported through a reflow oven or other means in which to heat the solder and polymerize the underfill, thereby effectively mounting the chips in place. The resulting chips are soldered into position on the printed circuit board, and include a complete underfill and surrounding polymeric fillet. Of course, if the underfill material is a prepolymerized, thermoplastic material, the heating step serves to melt the underfill, allowing it to flow and bond between the chip and the printed circuit board.

BRIEF DESCRIPTION OF THE DRAWINGS

FIG. 1 is a schematic representation of a wafer adhered to a temporary, expandable carrier substrate.

FIG. 2 is a schematic representation of a cut wafer adhered to a temporary, expandable carrier substrate.

FIG. 3 is a schematic representation of a cut wafer adhered to a temporary, expandable carrier substrate following stretching of the substrate.

FIG. 4 is a schematic representation of the wafer of FIG. 3 after an underfill coating has been applied to the wafer surface.

FIG. 5 is a schematic representation of a bumped flip chip having an underfill material covering its underside and edges.

DETAILED DESCRIPTION OF THE INVENTION

This invention involves a novel coating method for applying an underfill alone, flux in combination with an underfill, or combined flux-underfill liquids to a semiconductor wafer that has been pre-cut, or sawn, where the singulated chips are temporarily held in position by an adhesive-coated film tape. The particular flux and underfill materials are described in co-pending U.S. patent application Ser. No. 09/067,381, entitled "Flip Chip With Integrated Flux and Underfill", and in co-pending U.S. patent application Ser. No. 09/266,166, entitled "Flip Chip With Integrated Mask and Underfill". The teachings of these co-pending patent applications are incorporated herein by reference.

Several benefits are provided by the present invention. First, by singulating the semiconductor wafer prior to applying the underfill material, the difficult step of sawing the wafer and the hardened integral underfill material simultaneously is avoided. Second, the invention eliminates difficulties associated with visually locating the cutting lines, (called "streets"), on the wafer since sawing is carried out before application of underfill material. Third, the present invention yields chips having underfill coating each of their four edges. This edge coating provides the additional underfill material needed to form edge fillets during the solder reflow process. As noted above, fillets have been shown to increase the performance of underfill.

The invention is a multi-step process which can be described as follows. An uncut wafer having solder bumps provided on one surface is adhered to a temporary, expandable adhesive-coated carrier film. One preferred film of this type is commonly referred to as "Nitto Tape" (commercially available from Nitto-Denko, Ltd.). Once the wafer has been adhered to the carrier film, it is cut into individual chips in a process referred to as "singulation". Cutting is commonly achieved using a precision saw which is designed to make a narrow cut having clean edges. Additionally, the cutting process must be one which does not cut through the carrier substrate. Rather, the singulation is carried out in a manner that divides the wafer into individual chips, while leaving the carrier film intact. Following singulation, the tape is stretched or expand in a controlled, multidirectional manner. In so doing, the individual chips, while remaining adhered to the carrier substrate, are separated from each other, and spaces or channels are formed between them. To this point, the process described above is substantially the same as those currently known in the art.

The inventive portion of the process occurs following stretching of the carrier substrate and the related separation of the individual chips. Specifically, the separated chips, while still adhered to the carrier, are coated with the underfill material. In embodiments in which flux is necessary and is applied separately, the flux can be applied at this stage as well. Alternatively, in embodiments employing a flux-containing underfill or an underfill having fluxing properties, just the underfill material is applied to the wafer. The underfill is applied in a manner such that it covers the bumped surface to an appropriate depth (depending upon its fluxing characteristics) and also in a manner such that it surrounds the edges of each singulated chip. As discussed above, this edge coating provides desirable properties to the resulting fillet upon curing of the underfill material.

Once the underfill material has been applied to the bumped surface of each chip and its edges, it is caused or allowed to dry, and then the dried coating that lies in the spaces or channels between each chip is cut to thereby separate each coated chip for packaging and subsequent processing.

As noted previously, the steps of mounting a wafer on an expandable, adhesive carrier substrate, cutting the wafer into singulated chips, and then expanding the adhesive carrier substrate to isolate the individual chips from one another is well-known in the art. These steps are done routinely in the semiconductor and packaging fields. Equipment for carrying out these steps is available from several suppliers (such as Hover-Davis). This equipment typically is designed to stretch the carrier tape equally so that the space between the chips is approximately equal. This is normally done to permit easy chip removal from the tape without damaging chip edges as the chips are "picked" off the carrier. Unlike the prior art, one consideration of the present invention is to provide a controlled, preferably uniform, spacing that will become filled with liquid underfill material during the coating process. One method for adjusting the amount of underfill material applied to each chip is to alter the spacing between each chip. This adjustment is useful because the thickness of the underfill coating applied to the wafer will vary with the type of flip chips and their bump height.

As noted above, once the adhered wafer has been cut into individual chips and the spacing between those chips has been achieved to the desired value via stretching of the carrier, the underfill material can be applied. The incorporated applications describe two different flux-underfill systems, each of which employs a different set of coating steps when used in connection with the process of the present invention.

The process described above may be best understood with reference to the Figures. In FIG. 1, the adhered workpiece 10 comprises a bumped wafer 12 adhered to a surface of a temporary, expandable carrier substrate. As shown in FIG. 2, the wafer 12, while still adhered to the carrier substrate 14 has been sawed or cut along several pathways 16 to define a plurality of individual bumped chips 18. Following the cutting, the substrate 14 is stretched, as shown in FIG. 3, to isolate or singulate the individual flip chips 18 by forming spaces or channels 20 between them. In FIG. 4, the workpiece 10 has then been coated with the underfill material 22 which covers both the singulated chips 18 as well as the channels 20 between such chips. The underfill material 22 occupying the channels 20 is then cut and the individual underfill coated chips can be removed and packaged.

One such chip is shown schematically in FIG. 5. In FIG. 5, the underfilled, bumped chip 24 includes a singulated integrated circuit chip 18 having solder bumps 26 on its underside. An underfill coating has been provided in a manner such that it covers the underside of the chip (22a) and also extends a short distance beyond the edges of the chip (22b) in order to effectively provide a fillet having underfill which entirely surrounds the edge of the chip as well as coating the underside of the chip.

A two-component system having a separate flux and underfill composition, has been described in the previously incorporated application U.S. Ser. No. 09/067,381. In the two-component flux and underfill composition embodiment of the invention, the flux may be applied before the underfill by a dipping process. While dipping can be prior to sawing the bumped wafer, a preferred method is to apply the flux after the wafer has been sawed in order to avoid contamination of the flux by particles of silicon which may result from the cuts. The flux can be applied before or after the carrier substrate is stretched to isolate the individual chips. However, for large wafers, it is desirable to apply flux to the bumps before sawing so that high planarity is maintained. Furthermore, to be effective, flux only needs to be applied to the bumps, rather than to the entire underside of the flip chip, and this can be done using rolling or by dipping methods. The flux is allowed to dry on or entirely around the solder bumps.

The workpiece, comprising the sawed and flux coated wafer adhered to the carrier substrate, is now expanded or stretched via stretching of the carrier substrate to the give the desired spacing between chips. The stretching is preferably bidirectional to achieve the appropriate spacing between each chip. In some embodiments, this stretching may have been performed prior to the application of the flux, while in other embodiments, the stretching may occur after the application of the flux.

It should be noted that the flux described preferably has a low surface energy. As such, the flux resists over-coating by the underfill. Of course, as an alternative, the flux can be applied after the underfill has been coated and dried. It is noted that when employing an embodiment in which the flux and the underfill are separate compositions, the method used to provide the flux coating should only apply flux to the bumps, most preferably to the top surface of the bumps, since flux is not needed on the sides of the chip.

The underfill liquid is now ready to be applied. It is preferred that the coating methods produce a symmetrical deposition. Such methods include, but are not limited to, stencil printing, curtain coating and spraying. Spin coating, although possible, is generally not recommended because "shadowing" of cuts that are perpendicular to spin-induced flow direction may be deficient in material and the final coating may not be of uniform thickness. Once the underfill material has been applied, it is heated in order to dry the underfill coating. Heating is generally conducted for a period of time sufficient to bake out the solvent contained in the underfill material.

Dried coating contained in the channels between the singulated chips is then cut in order to separate the chips. This separation can be done with a wafer saw since the hardened underfills generally comprise high melting engineering thermoplastics with good sawing characteristics. Laser cutting can also be used, as can a numerically controlled knife cutting (NC knife). It is preferred that the carrier substrate not be cut through since chip removal is much easier if the tape remains as a single film.

A one-component coating system, having a combined flux and underfill composition, is described in the previously incorporated application U.S. Ser. No. 09/266,166. The same underfill coating methods as just described for the underfill portion of the two-component composition can be used for the one-component flux-underfill system. The cutting method for the dried material is also the same.

Following application of the coating to the underside of the chip and around its edges, the chips can be assembled to printed circuit boards using reflow soldering methods. The specifics of such assembly have been described in the previously incorporated applications. Of course, prior to use, the chips must be removed from the carrier substrate, and such chips are typically then stored in waffle packs or other standard presentation holders. The same equipment manufacturers that sell expanding (i.e., stretching) equipment offer machines that can pick up and place chips from the substrate. The common mechanism is to pull on the chip with a vacuum tool while simultaneously pushing against the back of the substrate with an "ejector" pin.

Upon exposing the inventive chips to reflow soldering, they will become soldered to a printed circuit board while simultaneously being provided with an underfill material positioned both between the chip and the printed circuit board, as well as around the edges of the chip. The edge coating is desirable because during the reflow heating, the underfill, being thermoplastic, softens or melts to form a fillet around the attached flip chip. The fillet improves bond strength and reduces stresses, particularly thermally-induced stresses, at the edge of the chip.

EQUIVALENTS

From the foregoing detailed description of the specific embodiments of the invention, it should be apparent that a novel heat transfer label and heat transfer labeling system has been described. Although particular embodiments have been disclosed herein in detail, this has been done by way of example for purposes of illustration only, and is not intended to be limiting with respect to the scope of the appended claims which follow. In particular, it is contemplated by the inventor that various substitutions, alterations, and modifications may be made to the invention without departing from the spirit and scope of the invention as defined by the claims.

What is claimed is:

1. A method for providing an underfill material on an integrated circuit chip which comprises the steps of:
    a) providing a wafer containing at least one integrated circuit chip, the integrated circuit chip having at least one solder bump provided on an exposed surface thereof;
    b) affixing the wafer to an expandable carrier substrate in a manner such that the bumped surface of the integrated circuit chip is exposed;
    c) cutting the wafer in a manner which defines edges on said at least one integrated circuit chip, the cutting being of a depth which does not cut the carrier substrate;
    d) expanding the carrier substrate in a manner which singulates said at least one integrated circuit chip, the singulation forming channels which surround the integrated circuit chip;

e) providing an underfill material on the bumped surface of the integrated circuit chip and in the channels defined by the edges of the integrated circuit chip; and f) cutting the underfill contained in the channels to thereby define at least one bumped integrated circuit chip having an underfill material provided on its bumped surface and surrounding its edges.

2. The method of claim 1, wherein at least the said at least one solder bump is provided with a flux material.

3. The method of claim 2, wherein the flux is provided by the underfill material.

4. The method of claim 2, wherein the flux is provided in an additional process step.

5. The method of claim 4, wherein the flux is provided before the carrier substrate is expanded.

6. The method of claim 1 wherein the expansion of the carrier substrate is a bidirectional expansion.

7. The method of claim 1, wherein the underfill material is provided to a depth which allows the at least one solder bump to be exposed.

8. The method of claim 1, wherein the underfill material covers the at least one solder bump.

9. A method for providing an underfill material on an integrated circuit chip which comprises the steps of:

a) providing at least one integrated circuit chip adhered to a temporary expandable carrier substrate having singulated channels formed thereon, the integrated circuit chip having an exposed surface and a plurality of edges defined by said singulated channels, the exposed surface having at least one solder bump thereon; and b) providing an underfill material on the bumped surface of the integrated circuit chip and on its edges.

10. The method of claim 9, wherein at least the said at least one solder bump is provided with a flux material.

11. The method of claim 10, wherein the flux is provided by the underfill material.

12. The method of claim 10, wherein the flux is provided in an additional process step.

13. The method of claim 9, wherein the underfill material is provided to a depth which allows the at least one solder bump to be exposed.

14. The method of claim 9, wherein the underfill material covers the at least one solder bump.

* * * * *